US012192712B2

United States Patent
Sung et al.

(10) Patent No.: US 12,192,712 B2
(45) Date of Patent: Jan. 7, 2025

(54) READOUT CIRCUIT FOR MICROPHONE SENSOR

(71) Applicant: FYD CO., LTD., Gyeonggi-do (KR)

(72) Inventors: Joon Jea Sung, Seoul (KR); Young Che Park, Gyeonggi-do (KR)

(73) Assignee: FYD CO., LTD., Gyeonggi-Do (KR)

( * ) Notice: Subject to any disclaimer, the term of this patent is extended or adjusted under 35 U.S.C. 154(b) by 265 days.

(21) Appl. No.: 18/087,967

(22) Filed: Dec. 23, 2022

(65) Prior Publication Data

US 2023/0262382 A1    Aug. 17, 2023

(30) Foreign Application Priority Data

Feb. 15, 2022  (KR) .......................... 10-2022-0019730

(51) Int. Cl.
*H04R 3/00* (2006.01)
*H03K 17/687* (2006.01)

(52) U.S. Cl.
CPC ........... *H04R 3/00* (2013.01); *H03K 17/6872* (2013.01); *H04R 2410/03* (2013.01)

(58) Field of Classification Search
CPC ................. H04R 3/00; H04R 2410/00; H04R 2410/03; H03F 3/505; H03F 3/185; H03F 3/1855; H03K 17/6872
See application file for complete search history.

(56) References Cited

U.S. PATENT DOCUMENTS

| | | | | |
|---|---|---|---|---|
| 5,589,799 | A | * 12/1996 | Madaffari | ............. H03F 3/1855 |
| | | | | 330/277 |
| 7,221,766 | B2 | * 5/2007 | Boor | ....................... H03F 1/301 |
| | | | | 381/111 |
| 9,402,131 | B2 | * 7/2016 | Jennings | .................. H04R 1/08 |
| 2014/0119573 | A1 | * 5/2014 | Kropfitsch | ............. H03F 1/086 |
| | | | | 330/253 |
| 2015/0318829 | A1 | 11/2015 | Astgimath | |
| 2017/0155365 | A1 | * 6/2017 | Yan | ........................... H03F 3/26 |
| 2017/0215006 | A1 | * 7/2017 | van Nieuwkerk | .... H03F 1/3205 |
| 2020/0010315 | A1 | 1/2020 | Tingleff et al. | |

FOREIGN PATENT DOCUMENTS

| | | |
|---|---|---|
| KR | 10-2015-0054214 A | 5/2015 |
| KR | 10-1718079 B1 | 3/2017 |
| KR | 10-1781555 B1 | 10/2017 |
| KR | 10-1996505 B1 | 10/2019 |
| WO | WO 2017/095981 A1 | 6/2017 |

* cited by examiner

*Primary Examiner* — Jason R Kurr
(74) *Attorney, Agent, or Firm* — The PL Law Group, PLLC

(57) ABSTRACT

A readout circuit for a microphone sensor includes a first transistor having a first gate end connected to the input terminal, a first source end connected to the output terminal and a power terminal, a first drain end connected to ground, a second transistor having a second drain end connected to the output terminal and the first source terminal, a second source end connected to the power terminal, and a second gate end connected to a reference terminal, a third transistor having a third drain end connected to the first source terminal, the second drain end, and the output terminal, a third gate terminal connected to the reference terminal, and a third source end connected to the ground, a fourth transistor having a fourth drain end, a fourth gate end, and a fourth source end connected to the first drain terminal, and a diode unit.

4 Claims, 4 Drawing Sheets

READOUT CIRCUIT FOR MICROPHONE SENSOR

CROSS-REFERENCE TO RELATED APPLICATION AND CLAIM OF PRIORITY

This application claims the benefit under 35 U.S.C. § 119 of Korean Patent Application No. 10-2022-0019730 filed on Feb. 15, 2022, in the Korean Intellectual Property Office, the entire disclosure of which is incorporated herein by reference for all purposes.

BACKGROUND

1. Field of the Invention

The present invention relates to a readout, and more particularly, to a readout circuit for a microphone sensor to provide a feedback circuit to a source follower having low noise characteristics, thereby implementing a low output impedance and a wide dynamic range to simplify the readout circuit, so as to miniaturize a chip, so that the cost competitiveness is ensured.

2. Description of the Related Art

A micro electro mechanical system (MEMS) refers to a technology that simultaneously integrates micrometer (μm, one-millionth of a meter)-sized ultra-fine mechanical parts and electronic circuits by applying a semiconductor manufacturing process. Since the microphone chip produced by the MEMS process is smaller in size and power consumption compared to the conventional electret condenser microphone (ECM), the microphone chip has been increasingly adopted for high-end mobile devices such as smartphones, tablets, and ear microphones is on the rise.

The MEMS microphone is largely classified into a capacitive-type and a piezoelectric-type. The capacitive MEMS microphone includes a sensor part for converting a physical signal into an electrical signal in response to external sound pressure, and a readout integrated circuit (ROIC) part for processing a high output impedance signal generated by an acoustic sensor.

In general, in the readout circuit of the MEMS microphone sensor, a source follower is used as a first-stage amplifier that converts a capacitor change according to sound pressure generated by the MEMS sensor into a voltage.

However, since this source follower circuit alone cannot drive a load corresponding to several [kΩ] to several [nF] while having a wide dynamic range, a buffer with a low output impedance is additionally required.

Accordingly, since the readout circuit necessarily has an increased chip size, it may be difficult to ensure the cost competitiveness.

SUMMARY

The problem to be solved by the present invention is to provide a readout circuit for a microphone sensor to implement a low output impedance with a wide dynamic range without adding a separate buffer.

Another problem to be solved by the present invention is to provide a readout circuit for a microphone sensor to simplify the readout circuit, thereby miniaturizing a chip, so that the cost competitiveness is ensured.

Other problems to be solved by the present invention will be clearer from the following detailed description and

DRAWINGS

According to one embodiment of the present invention, a readout circuit, for the microphone sensor, including an input terminal (IN) to which a sensing signal is inputted from the microphone sensor, and an output terminal (OUT) to which the sensing signal is outputted, includes: a first transistor (M1) having a first gate end connected to the input terminal (IN), a first source end connected to the output terminal (OUT) and a power terminal (VDD), and a first drain end connected to ground; a second transistor (M2) having a second drain end connected to the output terminal (OUT) and the first source terminal, a second source end connected to the power terminal (VDD), and a second gate end connected to a reference terminal (N); a third transistor (M3) having a third drain end connected to the first source terminal, the second drain end, and the output terminal (OUT), a third gate terminal connected to the reference terminal (N), and a third source end connected to the ground; a fourth transistor (M4) having a fourth drain end connected to the reference terminal (N) and the power terminal (VDD), a fourth gate end connected to the output terminal (OUT) and the third drain end, and a fourth source end connected to the first drain terminal; and a diode unit connected to the fourth drain end, the fourth source end, and the first drain end.

It may be preferable that the second transistor (M2) is any one transistor of NTR and PTR, and the third transistor (M3) is the other transistor of the NTR and the PTR.

In addition, the diode unit (M5) may use any one of an NTR diode connection, a PTR diode connection and a normal junction diode.

Further, the first transistor M1 and the second transistor (M2) may be a P-type transistor, and the third transistor (M3), the fourth transistor (M4) and the diode unit may be an N-type transistor.

The readout circuit for the microphone sensor according to the present invention has the advantageous effects as follows.

First, a feedback circuit is provided to a source follower having low noise characteristics, so that a low output impedance can be implemented.

Second, a wide dynamic range can be implemented due to the characteristic of class AB.

Third, the readout circuit is simply configured, thereby miniaturizing a chip, so that the cost competitiveness can be ensured.

DETAILED DESCRIPTION

Figure 1:
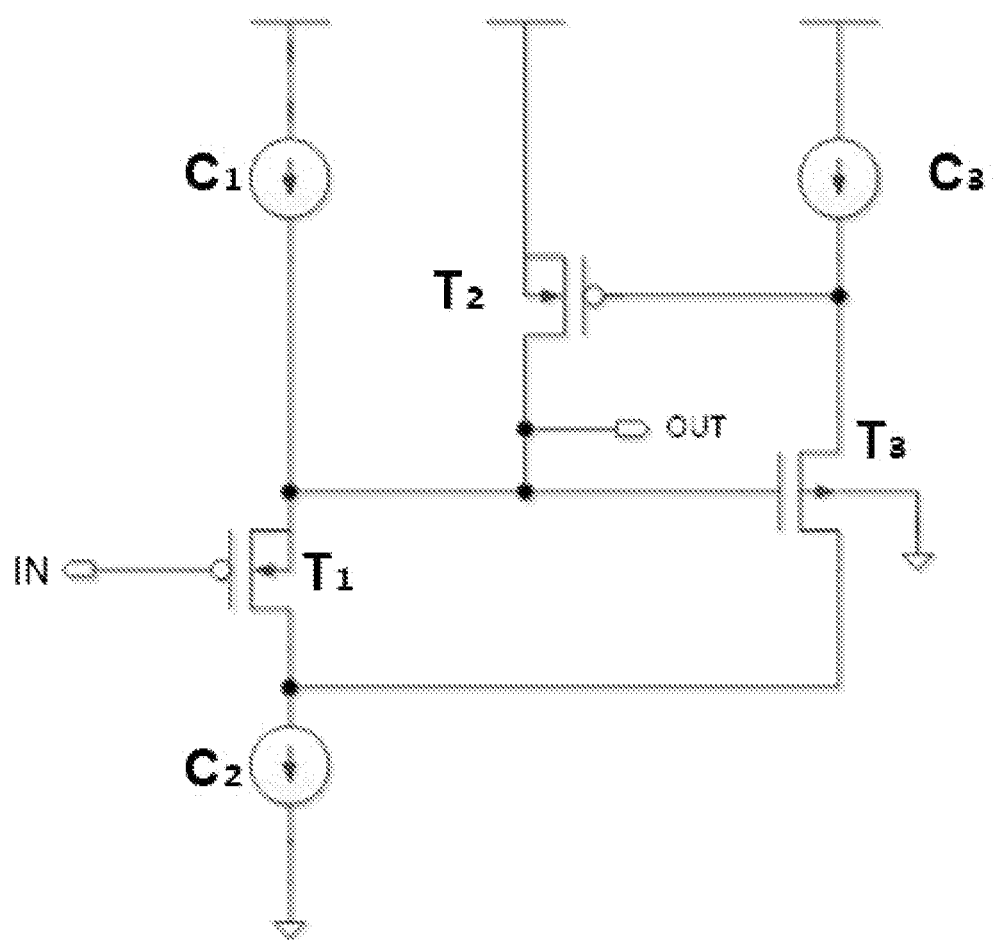
FIG. 1 is a view schematically showing the conventional readout circuit for a microphone sensor.

The present invention may be applied with various modifications and have various embodiments, and specific embodiments will be illustrated in the drawings and described in the detailed description in detail. However, it will be understood that it is not intended to limit the present invention to the specific embodiments, and the invention is intended to cover all modifications, equivalents, and alternatives falling within the spirit and scope without departing from the idea of the invention. Similar reference numerals are used for similar elements in describing the drawings.

Although the terms such as first, second, A and B may be used to describe various elements, the above elements will not be limited by the above terms. The terms are used only for the purpose of distinguishing one element from another element. For example, the first element may be referred to as the second element without departing from the scope of the present invention, and similarly, the second element may also be referred to as the first element. The term "and/or" includes any one of a plurality of relevant listed items or a combination thereof.

When one element is referred to as being "linked" or "connected" to other element, it will be understood that the element may be directly liked or connected to the other element, but another element may be present therebetween. On the contrary, when one element is referred to as being "directly linked" or "directly connected" to the other element, it will be understood that another element is not present therebetween.

The term used herein is merely for the purpose of illustrating a particular embodiment, and it is not intended to limit the present invention. The singular expression includes a plural expression unless the context clearly means otherwise. Herein, it will be understood that the term such as "include" and "have" is intended to designate the presence of feature, number, step, operation, element, component, or a combination thereof recited in the specification, which does not preclude the possibility of the presence or addition of one or more other features, numbers, steps, operations, elements, components, or combinations thereof.

Unless otherwise defined, all terms used herein including technical or scientific terms have the same meaning as commonly understood by those having ordinary skill in the art. Terms such as those defined in generally used dictionaries will be interpreted to have the meaning consistent with the meaning in the context of the related art, and will not be interpreted as an ideal or excessively formal meaning unless expressly defined in the present invention.

FIG. 1 is a view schematically showing the conventional readout circuit for a microphone sensor. As shown in FIG. 1, the conventional readout circuit 1 for a microphone sensor is composed of a feedback circuit by using transistor 1 T1, transistor 2 T2 and transistor 3 T3. The conventional readout circuit 1 for a microphone sensor may lower an output impedance by using the feedback circuit.

Whereas, when a load is present at an output end OUT, an output dynamic range may become decreased. Accordingly, hereinafter, a readout circuit 100 for a microphone sensor to solve the above problem will be described.

Figure 2:
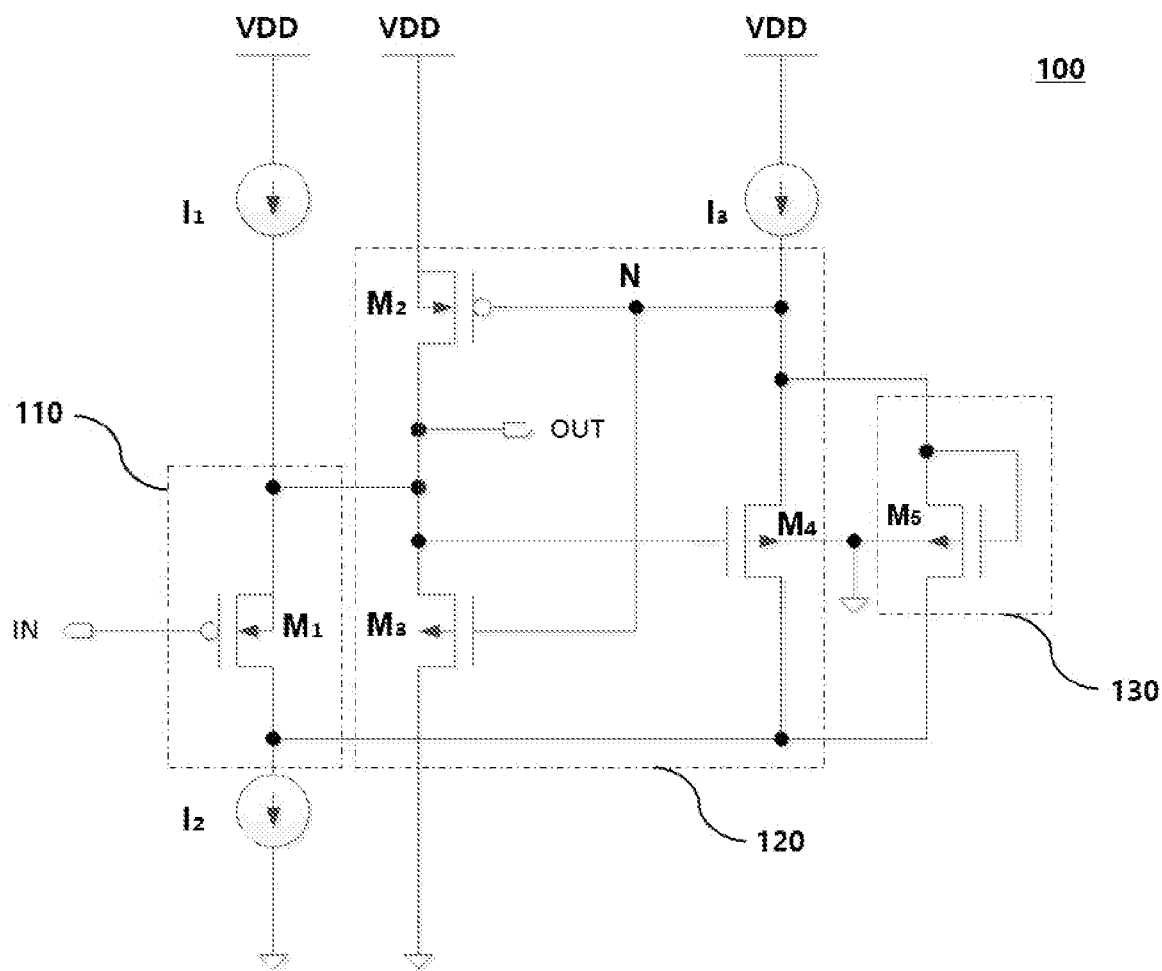
FIG. 2 is a draw showing a readout circuit for a microphone sensor according to one embodiment of the present invention.

FIG. 2 is a draw showing the readout circuit for the microphone sensor according to one embodiment of the present invention. the readout circuit 100 for the microphone sensor according to an embodiment of the present invention will be described with reference to FIG. 2.

First, the microphone sensor (not shown) senses a change in sound pressure through a bias voltage to generate a sensing signal. For example, the microphone sensor (not shown) may generate a sensing signal through a built-in sensor in response to an input bias voltage. The bias voltage refers to a voltage for biasing the microphone sensor (not shown) and may be generated by boosting a power supply voltage VDD by a charge pump.

The microphone sensor (not shown) may include a sensor that generates a sensing signal based on vibration of received sound waves. For example, a capacitive microphone sensor such as a micro electro mechanical system (MEMS) microphone may be used.

The microphone sensor (not shown) may include an electrode layer having spacing changeable according to sound pressure. The microphone sensor may have characteristics of a variable capacitor having a capacitance value changed according to the spacing of the electrode layer changed in the above manner. Accordingly, the magnitude of the sensing signal is changed according to the magnitude of the sound pressure received by the microphone sensor (not shown).

Referring to FIG. 1, in the readout circuit 100 for the microphone sensor according to an embodiment of the present invention, a sensing signal transmitted from the microphone sensor (not shown) is inputted to an input terminal IN and outputted through an output terminal OUT. In other words, the output terminal of the microphone sensor (not shown) is connected to the input terminal IN of the readout circuit 100.

The readout circuit 100 for the microphone sensor according to an embodiment of the present invention includes a buffer unit 110, a feedback unit 120 and a diode unit 130. The components of the readout circuit 100 for the microphone sensor may be integrated and implemented as one chip on the readout circuit 100 for the microphone sensor.

The buffer unit 110 is configured to amplify the sensing signal and transmit the amplified sensing signal to the output terminal OUT, and functions as a voltage buffer for the sensing signal provided from the microphone sensor (not shown). It may be preferable that the sensing signal inputted to the buffer unit 110 and the sensing signal amplified and outputted from the buffer unit 110 have the same phase.

The buffer unit 110 may be driven by a bias voltage applied from the power supply terminal VDD, in which a source follower circuit for performing a buffer function may be used therein. A first transistor M1 having a PMOSFET structure may be used in the buffer unit 110.

The first gate end of the first transistor M1 is connected to the input terminal IN. The first source end of the first transistor M1 is connected to the output terminal OUT, the power supply terminal VDD, the second drain end of the second transistor M2, and the third drain end of the third transistor M3. The first drain end of the first transistor M1 is connected to the ground. A current source I1 may be connected to the first source end of the first transistor M1. A current source I3 may be connected between the first drain end of the first transistor M1 and the ground.

The feedback unit 120 may generate a feedback voltage corresponding to an output voltage Vout to apply the generated feedback voltage to the first drain end of the first transistor M1 through a feedback path (not shown).

The feedback path is configured in the above manner, so that an output impedance Zin viewed from the output terminal OUT has a relatively very low impedance value compared to an impedance value (several [kΩ]) of the load. Accordingly, even the load having a resistance value of several [kΩ] may be driven.

The feedback unit 120 may include a second transistor M2, a third transistor M3, and a fourth transistor M4.

The second transistor M2 and the third transistor M2 may be used as transistors having different operating ranges. For example, the second transistor M2 may be used as any one transistor of NTR and PTR. The third transistor M3 may be the other transistor of the NTR and the PTR. In the present embodiment, the second transistor M2 uses a PMOS, and the third transistor M3 uses an NMOS. According to the above configuration, the output dynamic range is improved (extended).

The second source end of the second transistor M2 is connected to the power supply terminal VDD. The second drain end of the second transistor M2 is connected to the output terminal OUT, the first source end of the first transistor M1, and the third drain end of the third transistor M3. The second gate end of the second transistor M2 is connected to the reference terminal N.

The third drain end of the third transistor M3 is connected to the first source end of the first transistor M1, the second drain end of the second transistor M2, and the output terminal OUT. The third gate end of the third transistor M3 is connected to the reference terminal N. The third source end of the third transistor M3 is connected to the ground.

The fourth drain end of the fourth transistor M4 is connected to the reference terminal N, the power supply terminal VDD, and a fifth drain end of a fifth transistor M5. The fourth gate end of the fourth transistor M4 is connected to the output terminal OUT and the third drain end of the third transistor M3. The fourth source end of the fourth transistor M4 is connected to the first drain end of the first transistor M1 and the fifth source end of the fifth transistor M5. The current source 13 may be connected between the fourth drain end of the fourth transistor M4 and the power supply voltage.

The diode unit 130 may maintain operations of the feedback circuit regardless of the output voltage level of the fourth transistor M4. In other words, when the output descends to a low voltage by applying a negative (−) voltage to the input due to the third transistor M3 added to implement the characteristics of class AB to widen the dynamic range, the feedback configuration composed of the fifth transistor M5 may fail to operate and accordingly, the output may be fixed at 0. In this point, the fourth transistor 4 may be added to maintain the feedback configuration regardless of the output voltage, so that the wide dynamic range may be ensured.

The diode unit 130 may use an NTR diode connection, a PTR diode connection and a normal junction diode. In the present embodiment, the NMOS is used for the fourth transistor M4 and the fifth transistor M5.

Figure 3:
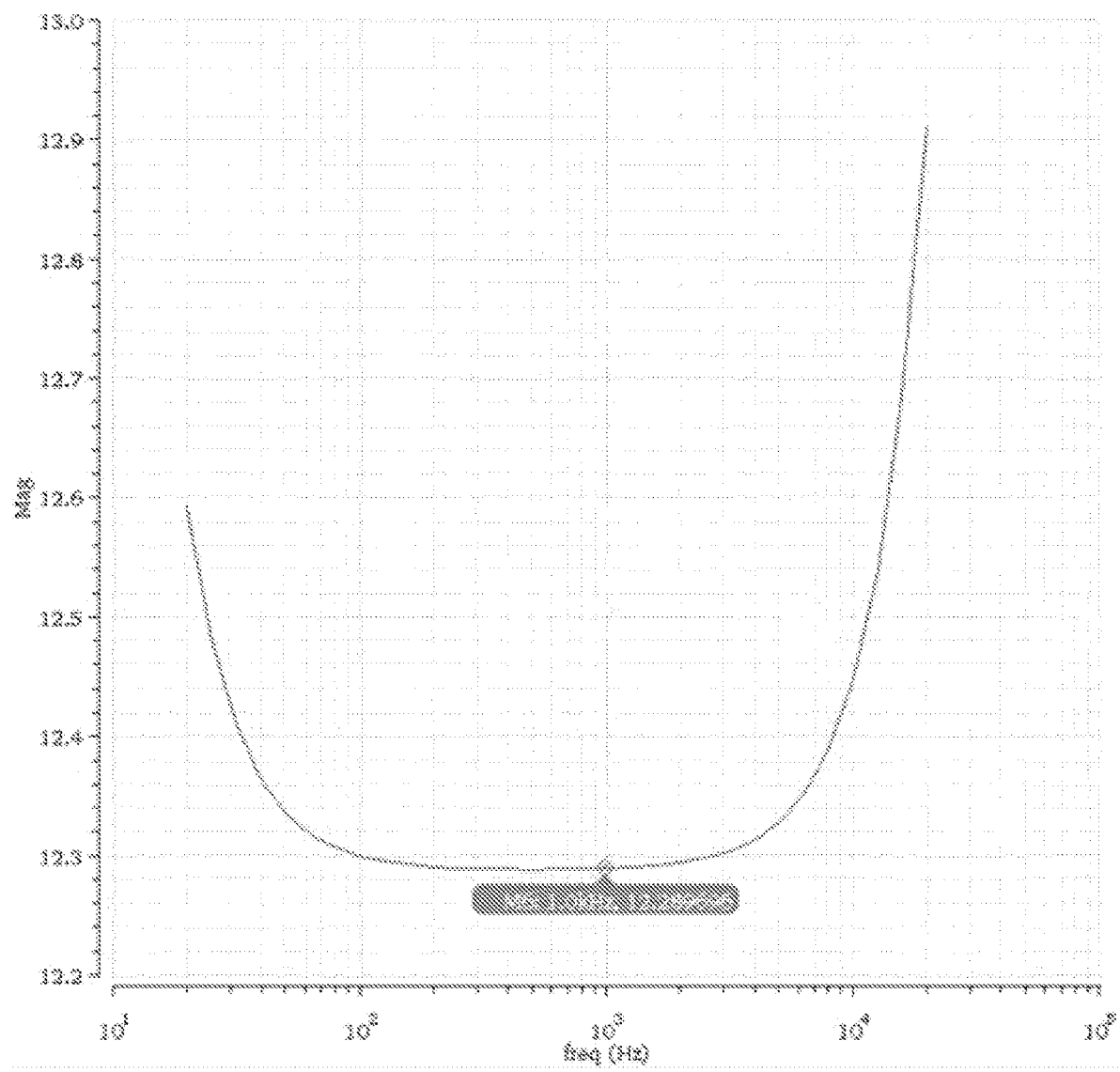
FIG. 3 is a draw showing low output impedance characteristics of the readout circuit for the microphone sensor according to one embodiment of the present invention.

FIG. 3 is a draw showing low output impedance characteristics of the readout circuit for the microphone sensor according to one embodiment of the present invention. The output impedance is measured while a 100 [kΩ] resistor and a 1 [uF] capacitor are connected in series to the output terminal OUT of the readout circuit for the microphone sensor according to an embodiment of the present invention.

Referring to FIG. 3, it can be seen that there is no problem even when driving a load of several [kΩ] since the readout circuit for the microphone sensor according to an embodiment of the present invention has the output impedance characteristics of about 12[Ω].

Figure 4:
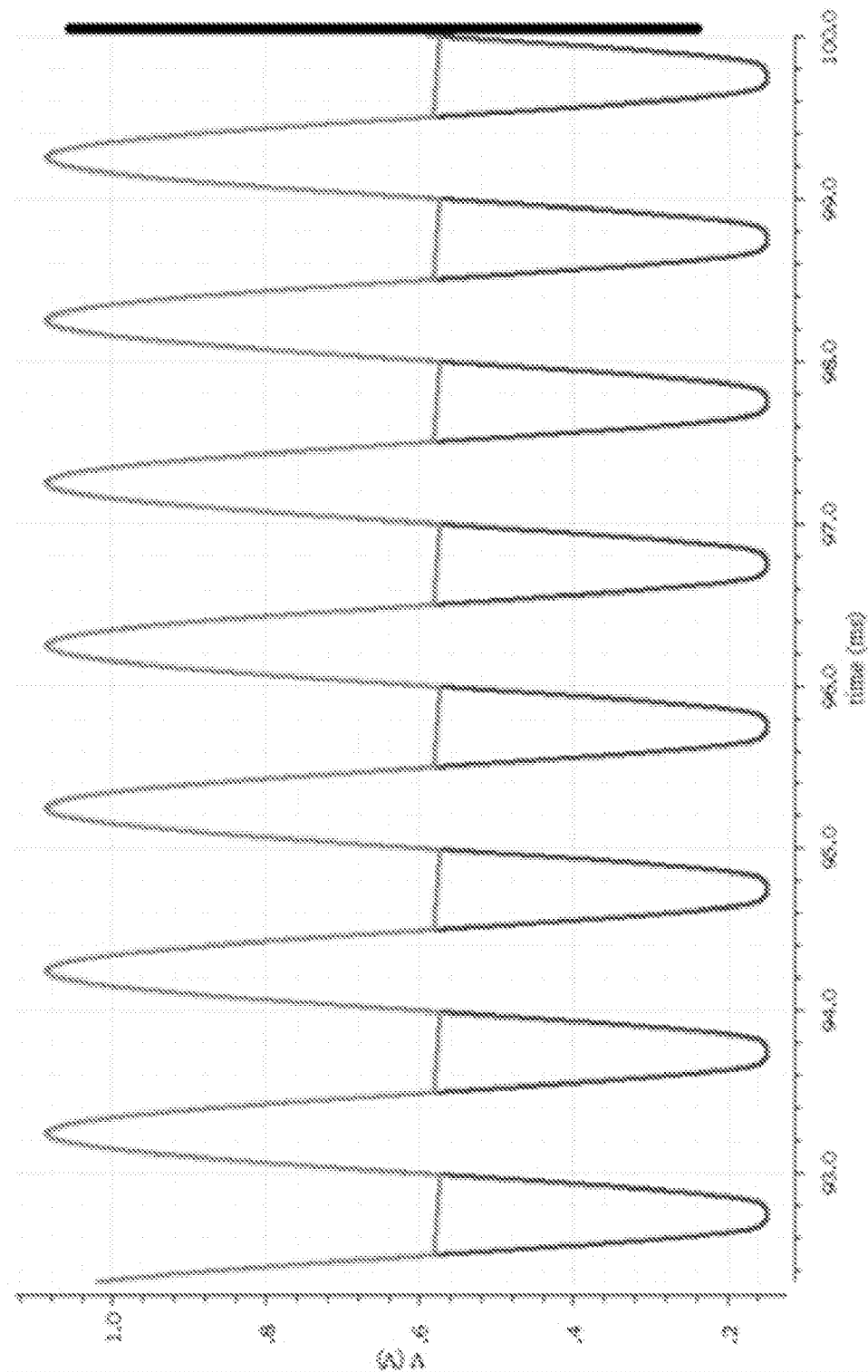
FIG. 4 is a view showing an output dynamic range of the readout circuit for the microphone sensor of FIG. 2 compared to the conventional readout circuit for the microphone sensor of FIG. 1.

FIG. 4 is a view showing an output dynamic range of the readout circuit for the microphone sensor of FIG. 2 compared to the conventional readout circuit for the microphone sensor of FIG. 1.

The dynamic range is measured while a 100 [kΩ] resistor and a 1 [uF] capacitor are connected in series to the output terminal OUT of the readout circuit for the microphone sensor according to an embodiment of the present invention.

As shown in FIG. 4, the red line is the output dynamic range of the readout circuit 100 for a microphone sensor of FIG. 2, and the green line is the output dynamic range of the conventional readout circuit 1 for a microphone sensor.

Referring to FIG. 4, it can be seen that the readout circuit 100 for the microphone sensor according to an embodiment of the present invention has the output dynamic range about twice as wide compared to the conventional readout circuit for the microphone sensor 1.

As a result, the readout circuit for the microphone sensor according to the present invention has characteristics of low noise, low output impedance, and wide dynamic range without adding a separate buffer. Accordingly, the readout circuit is simply configured, so as to miniaturize a chip, so that the cost competitiveness can be ensured.

Although the present invention has been described in detail through preferred embodiments, embodiments of other forms are also possible. Therefore, the spirit and scope of the claims set forth below are not limited to the preferred embodiments.

What is claimed is:

1. A readout circuit for a microphone sensor, the readout circuit comprising:
    an input terminal to which a sensing signal is configured to be inputted from the microphone sensor; and
    an output terminal to which the sensing signal is configured to be outputted;
    a first transistor having a first gate end connected to the input terminal, a first source end connected to the output terminal and a power terminal, and a first drain end connected to ground;
    a second transistor having a second drain end connected to the output terminal and the first source terminal, a second source end connected to the power terminal, and a second gate end connected to a reference terminal;
    a third transistor having a third drain end connected to the first source terminal, the second drain end, and the output terminal, a third gate terminal connected to the reference terminal, and a third source end connected to the ground;
    a fourth transistor having a fourth drain end connected to the reference terminal and the power terminal, a fourth gate end connected to the output terminal and the third drain end, and a fourth source end connected to the first drain terminal; and
    a diode unit connected to the fourth drain end, the fourth source end, and the first drain end.

2. The readout circuit of claim 1, wherein the second transistor includes any one transistor of a N-type transistor (NTR) and a P-type transistor (PTR), and the third transistor includes an opposite transistor of the NTR and the PTR.

3. The readout circuit of claim 1, wherein the diode unit uses any one of an N-type transistor (NTR) diode connection, a P-type transistor (PTR) diode connection and a normal junction diode.

4. The readout circuit of claim 1, wherein the first transistor and the second transistor includes a P-type transistor, and the third transistor, the fourth transistor and the diode unit includes an N-type transistor.

* * * * *